US008748305B2

(12) United States Patent
Chen

(10) Patent No.: US 8,748,305 B2
(45) Date of Patent: Jun. 10, 2014

(54) PAD STRUCTURE FOR SEMICONDUCTOR DEVICES

(75) Inventor: Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 552 days.

(21) Appl. No.: 12/620,250

(22) Filed: Nov. 17, 2009

(65) Prior Publication Data

US 2011/0115073 A1    May 19, 2011

(51) Int. Cl.
*H01L 23/488* (2006.01)

(52) U.S. Cl.
USPC ..... 438/612; 257/737; 257/776; 257/E23.023

(58) Field of Classification Search
USPC ........... 257/737, 776, E23.023; 438/622, 612
See application file for complete search history.

(56) References Cited

U.S. PATENT DOCUMENTS

| 8,138,616 | B2* | 3/2012 | Chang et al. .................. 257/784 |
| 2005/0167842 | A1* | 8/2005 | Nakamura et al. ............ 257/758 |
| 2007/0290361 | A1* | 12/2007 | Chen .............................. 257/773 |
| 2008/0135840 | A1* | 6/2008 | Peng et al. ....................... 257/48 |
| 2008/0169486 | A1* | 7/2008 | Toyoshima et al. ........... 257/203 |

\* cited by examiner

*Primary Examiner* — Matthew W Such
*Assistant Examiner* — Krista Soderholm
(74) *Attorney, Agent, or Firm* — Haynes and Boone, LLP

(57) ABSTRACT

A semiconductor device is provided which includes a semiconductor substrate having a plurality of microelectronic elements formed therein; an interconnect structure formed over the substrate, the interconnect structure including metal layers isolated from one another by an inter-metal dielectric, the metal layers including a topmost metal layer; dummy metal vias formed between at least two metal layers and disposed within a region of the interconnect structure; and a bonding pad formed over the topmost metal layer such that the bonding pad is aligned with the region of the interconnect structure.

20 Claims, 8 Drawing Sheets

PAD STRUCTURE FOR SEMICONDUCTOR DEVICES

BACKGROUND

In semiconductor technologies, a wafer undergoes various processes to form an integrated circuit. The wire routing of the integrated circuit is provided by an interconnect structure that includes numerous metal layers that are each insulated by a dielectric layer. Bonding pads are typically formed over the interconnect structure for use in wafer level testing and chip packaging (e.g., wire bonding and flip-chip). In advanced technology process (e.g., 45 nm, 32 nm, and beyond), it is desirable to implement dielectric materials having a low dielectric constant (low-k) in the interconnect structure to enhance performance. However, these low-k materials have weak mechanical strength properties which can cause peeling or cracking of the metal layers especially in a region where there is high stress such as a region underneath the bonding pad. Therefore, peeling and cracking of the metal layers can lead to poor device performance, and in some cases device failure.

SUMMARY

One of the broader forms of an embodiment of the present invention involves a semiconductor device. The semiconductor device includes a semiconductor substrate having a plurality of microelectronic elements formed therein; an interconnect structure formed over the substrate, the interconnect structure including a plurality of metal layers and a plurality of inter-metal dielectric (IMD) layers for isolating the metal layers, the metal layers including a topmost metal layer, a bottommost metal layer, and at least two metal layers disposed between the topmost metal layer and the bottommost metal layer; a plurality of dummy metal vias formed within one or more of the IMD layers disposed between the at least two metal layers; and a pad structure formed directly over the dummy metal vias.

Another one of the broader forms of an embodiment of the present invention involves a method for fabricating a semiconductor device. The method includes providing a semiconductor substrate having a plurality of microelectronic elements formed therein; forming an interconnect structure over the substrate including a plurality of metal layers and a plurality of inter-metal dielectric (IMD) layers, the metal layers including a topmost metal layer, a bottommost metal layer, and at least two metal layers disposed between the topmost metal layer and the bottommost metal layer; forming a plurality of dummy metal vias within one or more IMD layers disposed between the at least two metal layers; and forming a pad structure directly over the dummy metal vias.

Yet another one of the broader forms of an embodiment of the present invention involves a semiconductor device. The semiconductor device includes a semiconductor substrate having a plurality of microelectronic elements formed therein; an interconnect structure formed over the semiconductor substrate, the interconnect structure including a topmost metal layer and a bottommost metal layer, the topmost metal layer including a metal pad; and a plurality of dummy metal vias formed within one or more inter-metal dielectric (IMD) layers disposed between the topmost metal layer and the bottommost metal layer, the dummy metal vias directly underlying the metal pad of the topmost metal layer, the dummy vias establishing a predetermined via density within a region of the interconnect structure that directly underlies the metal pad of the topmost metal layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
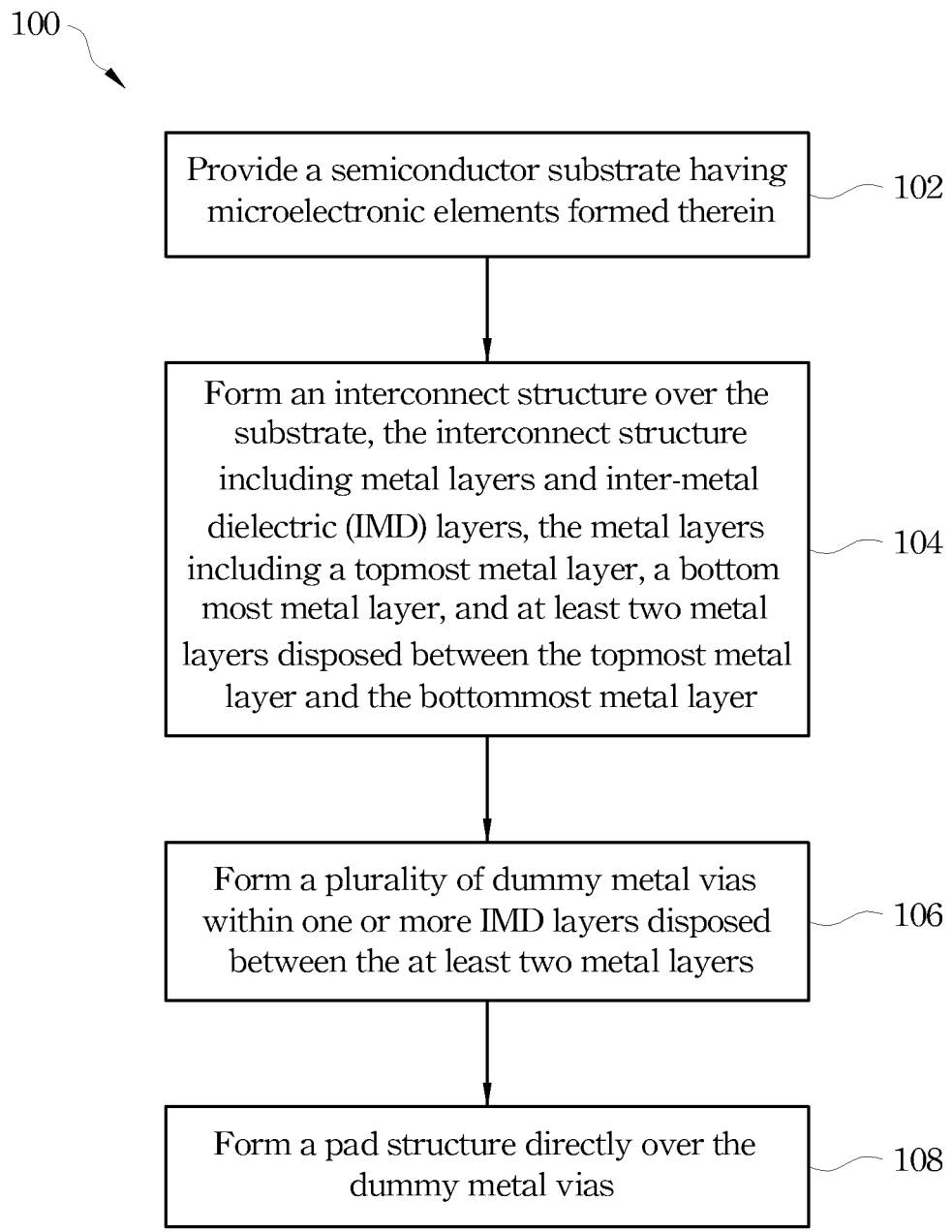
FIG. 1 is a flowchart of a method of fabricating a semiconductor device according to various aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flowchart of a method 100 of fabricating a semiconductor device according to various aspects of the present disclosure. The method 100 begins with block 102 in which a semiconductor substrate is provided that includes microelectronic elements formed therein. The method 100 continues with block 104 in which an interconnect structure is formed over the semiconductor substrate. The interconnect structure comprises metal layers and inter-metal dielectric (IMD) layers. The metal layers include a topmost metal layer, a bottom most metal layer, and at least two metal layers disposed between the topmost metal layer and the bottommost metal layer. The method 100 continues with block 106 in which dummy metal vias are formed within one or more IMD layers disposed between the at least two metal layers. The method 100 continues with block 108 in which a pad structure is formed directly over the dummy metal vias. The method 100 may be implemented to fabricate various embodiments of a semiconductor device as described in detail below.

Figure 2:
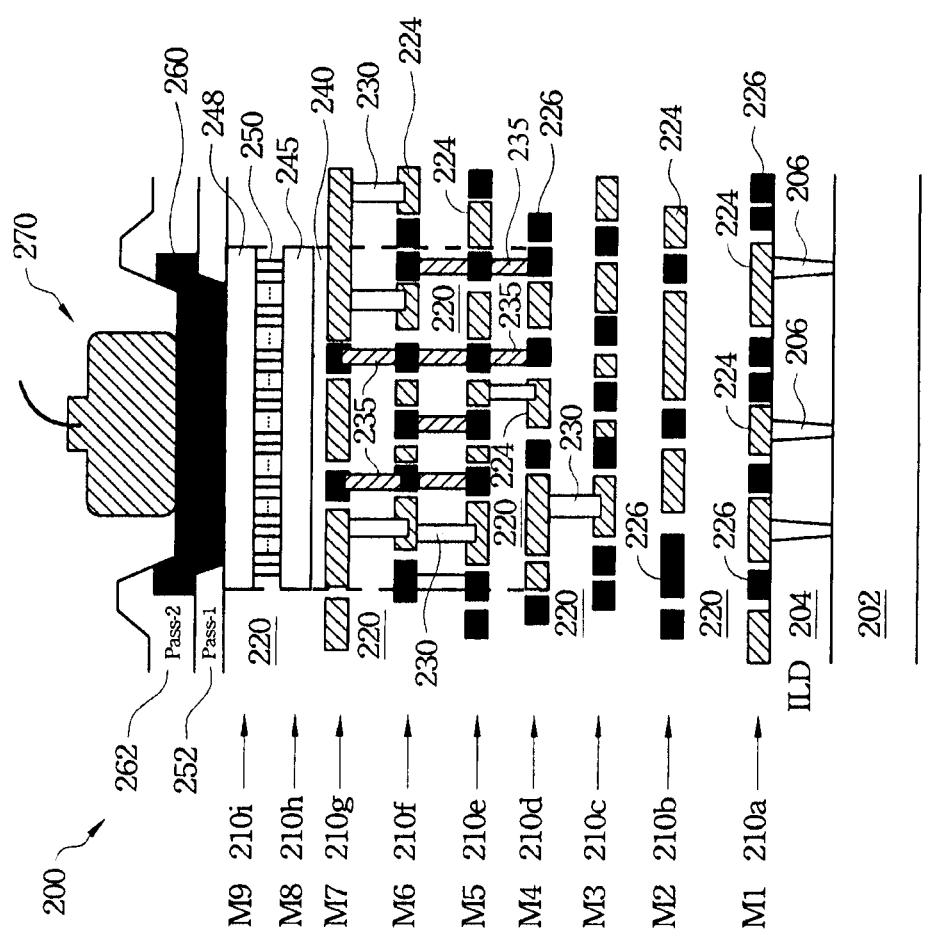
FIG. 2 is a cross-sectional view of a semiconductor device having an embodiment of a pad structure according to various aspects of the present disclosure.

Referring to FIG. 2, illustrated is a cross-sectional view of a semiconductor device 200 having a pad structure according to various aspects of the present disclosure. In an embodiment, the semiconductor device 200 may be fabricated according to the method 100 of FIG. 1. It is understood that the semiconductor device 200 includes various features and structures but is simplified for a better understanding of the inventive concepts of the present disclosure. The semiconductor device 200 includes a semiconductor substrate 202 such as a silicon substrate in a crystalline structure. The substrate 202 may also include other elementary semiconductors such as germanium. Alternatively, the substrate 202 may optionally include a compound semiconductor such as silicon carbide, gallium arsenic, indium arsenide, and indium phosphide. Also, the substrate 202 may optionally include an epitaxial layer (epilayer) formed by an epitaxial growth process. The semiconductor device 200 may further comprise a plurality of isolation features (not shown), such as shallow trench isolation (STI) features or local oxidation of silicon (LOCOS) features.

The isolation features may define and isolate active regions for various microelectronic elements (not shown), such as transistors (metal oxide semiconductor field effect transistor (MOSFET), complementary metal oxide semiconductor (CMOS) transistor, bipolar junction transistor (BJT), high voltage transistor, high frequency transistor, etc.), resistors, diodes, capacitors, and other suitable elements. Accordingly, various processes are performed such as deposition, etching, implantation, photolithography, annealing, and other suitable processes that are available to one of ordinary skill in the art to form the microelectronic elements. The microelectronic elements are interconnected to form an integrated circuit such as a logic device, memory device (e.g., SRAM), RF device, input/output (I/O) device, system-on-chip (SoC) device, combinations thereof, and other suitable type of devices known in the art.

The semiconductor device 200 further includes an inter-layer dielectric (ILD) 204 formed over the substrate 202 including the microelectronic elements. The ILD layer 204 may include silicon oxide, silicon oxynitride, or a low-k material. The ILD layer 204 may be formed by chemical vapor deposition (CVD), high density plasma CVD (HDP-CVD), spin-on, physical vapor deposition (PVD or sputtering), or other suitable technique. It should be noted a stressed layer such as a contact etch stop layer (CESL) may be formed over the substrate 202 prior to forming the ILD layer 204. The semiconductor device 200 further includes a plurality of contacts 206 (also referred to as first contacts) formed in the ILD layer 204. The contacts 206 may be formed by first patterning and etching the ILD layer 204 to form trenches. The trenches may be filled by depositing a metal barrier layer such as TiN, and then depositing a contact plug layer such as W on the metal barrier layer. In some embodiments, the metal barrier layer may include Ti/TiN for a W contact plug. In some other embodiments, the metal barrier layer may include Ta/TaN for a Cu contact plug. The contacts 206 provide connections to the various microelectronic elements formed in the substrate 202.

The semiconductor device 200 further includes an interconnect structure. The interconnect structure includes a plurality of metal layers 210a-i that provide interconnections (wiring) between the various microelectronic, and between metal layers themselves. It is understood that the number of metal layers may vary depending on the design of the particular semiconductor device. In the disclosed embodiment, the metal layers 210a-i include nine (9) metal layers with a bottommost metal layer 210a (M1), a topmost metal layer 210i (M9), and metal layers 210b-h (M2-M8) between the bottommost metal layer and topmost metal layer. The metal layers 210a-i (M1-M9) may include lines formed of a conductive material such as aluminum, aluminum/silicon/copper alloy, titanium, titanium nitride, tungsten, polysilicon, metal silicide, or combinations thereof. Alternatively, the metal layers 210a-i may include lines formed of copper, copper alloy, titanium, titanium nitride, tantalum, tantalum nitride, tungsten, polysilicon, metal silicide, or combinations thereof.

The metal layers 210a-i (M1-M9) may be insulated from each other by inter-metal dielectric (IMD) layers 220. The IMD layers 220 may include a material of a low dielectric constant or low k value (low-k). In some embodiments, the IMD layers 220 at various levels of the interconnect structure may be formed of different dielectric materials. It is has been observed that IMD layers 220 with low-K (LK), extreme low-K (ELK), and/or extra low-k (XLK) materials may enhance circuit performance. The material classification may be based upon a dielectric constant. For example, LK materials may refer to those materials with a k value less than approximately 3.5, and preferably less than approximately 3.0. The ELK materials may refer to those materials with a k value less than approximately 2.9, and preferably less than approximately 2.6. The XLK materials may refer to those materials which typically have a k value less than approximately 2.4. It is understood that the classifications are mere examples and that other classifications based on the dielectric constant of the material may be utilized as well. The LK, ELK, and/or XLK dielectric materials may comprise silicon nitride, silicon oxynitride, spin-on glass (SOG), undoped silicate glass (USG), fluorinated silica glass (FSG), carbon doped silicon oxide (e.g., SiCOH), carbon-containing material, Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric materials, other suitable dielectric materials, and/or combinations thereof. The IMD layers 220 may be formed by a technique including spin-on, CVD, PVD, or atomic layer deposition (ALD).

Though the LK, ELK, and XLK dielectric materials enhance circuit performance, such materials (e.g., porous materials) have been observed to exhibit poor mechanical strength, and thus may tend to peel, crack, and/or delaminate under stresses induced by various semiconductor processes. Additionally, it has been observed that the higher metal layers may suffer higher stress than lower metal layers according to stress distribution analysis. For example, the top metal layers 220d-i (M4 and above) and the IMD layers 220 within a region 240 (depicted as region with dashed line) directly underlying a pad structure, bonding structure, or bump structure suffer high mechanical stress during chip packaging. Therefore, a higher risk of peeling, cracking, and/or delamination is present within the region 240 as compared to other regions of the interconnect structure. Additionally, an interface between the middle metal layers (M4/M5 or M5/M6) may have the highest risk of film cracking. Accordingly, the features and structures disclosed below provide cost-effective and efficient techniques to reinforce the mechanical strength of the IMD layers 220 within the region 240. However, it is understood that the features and structures disclosed below may also be implemented to reinforce or strengthen other regions of the interconnect structure and/or other dielectric layers of the semiconductor device 200 where applicable.

The metal layers 210a-i and the IMD layers 220 may be formed in an integrated process such as a damascene process or lithography/plasma etching process. The bottommost metal layer 210a (M1) may include metal lines 224 that are coupled to the contacts 206 for connecting to the microelectronic elements formed in the substrate 202. The bottommost metal layer 210a (M1) may further include dummy metal lines 226 that are not electrically connected to any functional circuit and/or pad. Instead, the dummy metal lines 226 may be used, for example, to adjust a local pattern density for better polishing effect. The metal layers 210b-g (M2-M7) may also include metal lines 224 and dummy metal lines 226. The interconnect structure may further include various metal vias 230 disposed within the IMD layers 220 for connecting the metal lines 224 of adjacent metal layers 220a-i. The interconnect structure may further include dummy metal vias 235 that are disposed within the IMD layers 220 in the region 240. The dummy metal vias 235 are not electrically connected to any functional circuit and/or pad. Instead, the dummy metal vias 235 may connect the dummy metal lines 226 of adjacent metal layers 210d-g (e.g., M4/M5, M5/M6, and M6/M7). Accordingly, the dummy metal vias 235 reinforce the mechanical strength of the IMD layers 220 within the region 240.

In one embodiment, the dummy metal vias 235 and the true metal vias 230 (within one or more IMD layers of the region 240) may combine to establish a via density of about 1.5%. The via density may be locally calculated under a pad structure, bonding structure, or bump structure as discussed in greater detail below. In another embodiment, the dummy metal vias 235 and the true metal vias 230 (within one or more IMD layers of the region 240) may combine to establish a via density of about 3.0%. In other embodiments, the dummy metal vias 235 may be inserted between the metal layers 210d (M4) and 210e (M5) to establish a via density greater than 1.5% within the IMD layer 220 (between M4 and M5) of the region 240. It should be noted the specified via density percentages have been found to effectively improve the mechanical strength of the IMD layers 220 of the region 240. However, it is understood that other percentages of via densities with respect to the dummy metal vias may be utilized depending on design requirements and/or available foot print.

The topmost metal layer 210i (M9) and the metal layer 210h (M8) include a double metal pad configuration. For example, the metal layer 210h (M8) includes a metal pad 245 and the topmost metal layer 210i (M9) includes a metal pad 248. The metal pad 245 may include a similar shape and size as the metal pad 248. The metal pads 245 and 248 are coupled to each other by metal vias 250 disposed within the IMD layer 220. In other embodiments, the interconnect structure may include a single metal pad configuration where the metal pad is only formed in the topmost metal layer 220i (M9). As such, the dummy metal vias may be inserted between the metal layers 210g (M7) and 210h (M8) as well.

The semiconductor device 200 may further include a passivation layer 252 (Pass-1) formed over the topmost metal layer 210i (M9) to cover and protect the interconnect structure. The passivation layer 252 may include silicon oxide, silicon nitride, silicon oxynitride, or combinations thereof. The passivation layer 252 may be formed by CVD, spin-coating, or other suitable techniques.

The semiconductor device 200 may further include a bonding pad 260. The bonding pad 260 may be formed on the metal pad 248 of the topmost metal layer 210i (M9). The bonding pad 260 may be configured to provide an electrical connection with the interconnect structure for wafer level testing, wiring, or chip packaging. The bonding pad 260 may be formed within the passivation layer 252 by a process known in the art. For example, an etching process may be performed on the passivations layer 252 to open up the metal pad 248 of the topmost metal layer 210i (M9). A conductive material layer may be deposited over the passivation layer 252 filling in the opening. The conductive layer may then be patterned to form the bonding pad 260. The bonding pad 260 may include an electrically conductive material such as aluminum, aluminum alloy, copper, copper alloy, or combinations thereof. The profile of the bonding pad 260 may have a suitable step height in order to achieve adequate bonding properties.

A passivation layer 262 (Pass-2) may be formed over the passivation layer 252 and patterned to expose the bonding pad 260. The passivation layer 262 may include silicon oxide, silicon nitride, silicon oxynitride, or combinations thereof. The passivation layer 262 may be formed by CVD, spin-coating, or other suitable techniques. The semiconductor device 200 further includes a wire bonding assembly 270. The wire bonding assembly may be formed in contact with the bonding pad 260. The wire bonding assembly 270 may be formed by various known wire bonding techniques such as thermosonic bonding and thermocompression bonding. Generally, wire bonding employs mechanical force, thermal energy, and acoustic energy to attach wires to the bonding pad 260. The thickness the bonding pad 260 provides adequate bonding properties for the various bonding techniques. The wire bonding assembly 270 allows connection of the semiconductor device 200 with an external components.

It should be noted that the via density of the dummy metal vias 235 within the region 240 may be locally calculated under various structures. In one embodiment, a local area under the bonding pad 260 may be used to calculate the via density. Accordingly, the via density may be expressed as (area of vias/area of bonding pad). In still other embodiments, a local area under the metal pad 248 of the topmost metal layer 210i (M9) may be used to calculate the via density. Accordingly, the via density may be expressed as (area of vias/area of metal pad).

Figure 3:
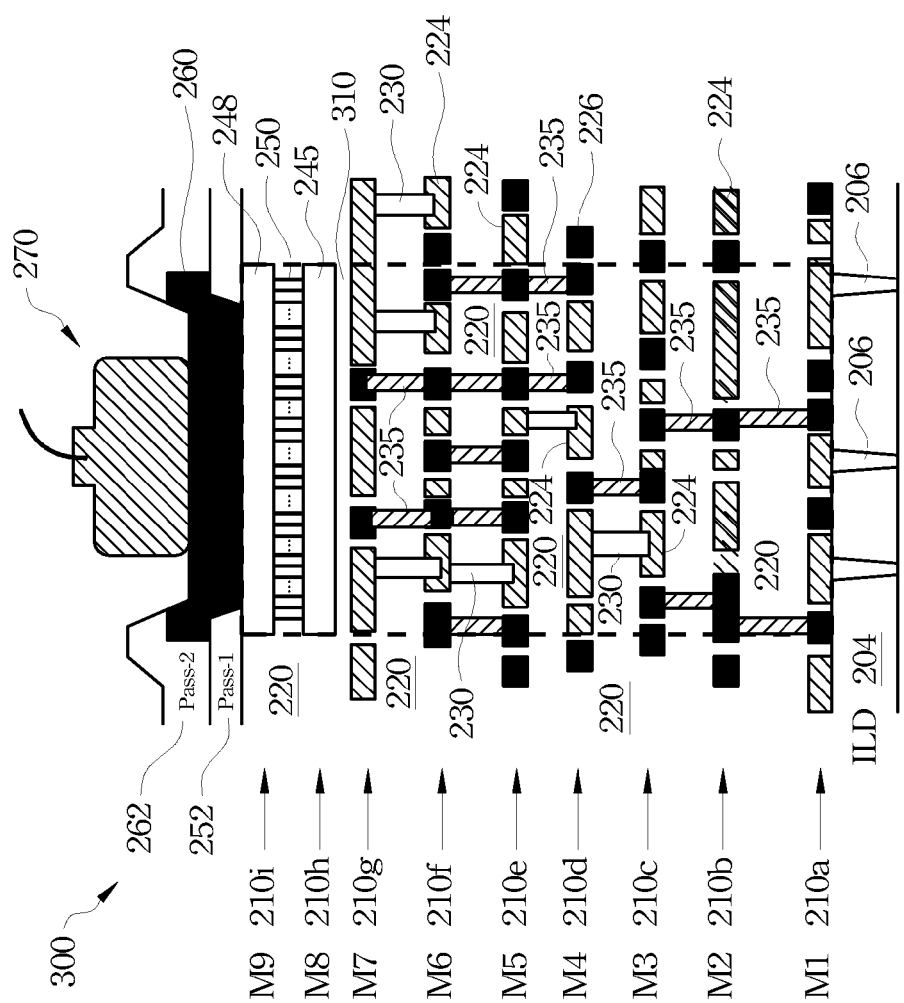
FIG. 3 is a cross-sectional view of a semiconductor device having an alternative embodiment of a pad structure according to various aspects of the present disclosure.

Referring to FIG. 3, illustrated is a cross-sectional view of a semiconductor device 300 having a pad structure according to various aspects of the present disclosure. In an embodiment, the semiconductor device 300 may be fabricated according to the method 100 of FIG. 1. The semiconductor device 300 is similar to the semiconductor device 200 of FIG. 2 except for the differences discussed below. Accordingly, similar features in FIGS. 2 and 3 are numbered the same for the sake of simplicity and clarity. The semiconductor device 300 includes dummy metal vias 235 that are disposed within a region 310. The region 310 is similar to the region 240 of FIG. 2 except that the region 310 is extended to include the lower metal layers 210a-c (M1-M3). Accordingly, the dummy metal vias 235 may be inserted between the metal layers 210a-g (M1-M7) directly underlying the metal pad 248 of the topmost metal layer 210i (M9) or the bonding pad 260. Thus, the via density may be locally calculated under an area of the metal pad 248 or the bonding pad 260. For example, the via density in one embodiment, the dummy metal vias 235 and the true metal vias 230 (within one or more IMD layers of the region 310) may combine to establish a via density of about 1.5%. In another embodiment, the dummy metal vias 235 and the true metal vias 230 (within one or more IMD layers of the region 310) may combine to establish a via density of about 3.0%. In other embodiments, the dummy metal vias 235 may be inserted between the metal layers 210d (M4) and 210e (M5) to establish a via density greater than 1.5% within the IMD layer 220 (between M4 and M5) of the region 310.

The additional dummy vias disposed between the lower metal layers may further improve the mechanical strength of the IMD layers 220 within the region 310. It should be noted that the semiconductor device 300 may optionally employ a single metal pad configuration, and thus dummy metal vias may also be inserted between the metal layers 210g (M7) and 210h (M8).

Figure 4:
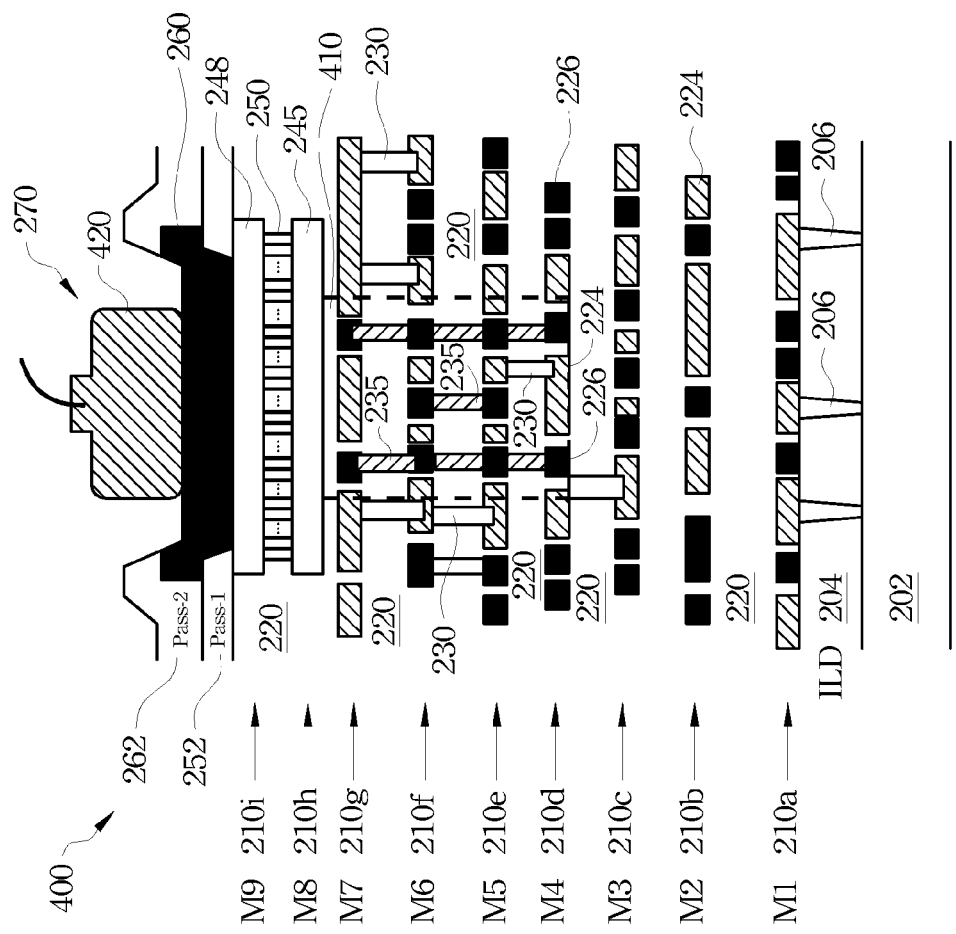
FIG. 4 is a cross-sectional view of a semiconductor device having another alternative embodiment of a pad structure according to various aspects of the present disclosure.

Referring to FIG. 4, illustrated is a cross-sectional view of a semiconductor device 400 having a pad structure according to various aspects of the present disclosure. In an embodiment, the semiconductor device 400 may be fabricated according to the method 100 of FIG. 1. The semiconductor device 400 is similar to the semiconductor device 200 of FIG. 2 except for the differences discussed below. Accordingly, similar features in FIGS. 2 and 4 are numbered the same for the sake of simplicity and clarity. The semiconductor device 400 includes dummy metal vias 235 that are disposed within a region 410. The region 410 is similar to the region 240 of FIG. 2 except that the region 410 directly underlies a wire bump structure 420 of the wire bonding assembly 270. Accordingly, the dummy metal vias 235 are disposed between the metal layers 210d-g (M4-M7) directly underlying the wire bump structure 420 of the wire bonding assembly. Thus, the via density may be locally calculated under an area of the wire bump structure 420. For example, the wire bump structure may have a diameter D, and thus the local area under the wire bump structure can expressed as $(D^2/4*\pi)$.

In one embodiment, the dummy metal vias 235 and the true metal vias 230 (within one or more IMD layers of the region 410) may combine to establish a via density of about 1.5%. In another embodiment, the dummy metal vias 235 and the true metal vias 230 (within one or more IMD layers of the region 410) may combine to establish a via density of about 3.0%. In other embodiments, the dummy metal vias 235 may be inserted between the metal layers 210d (M4) and 210e (M5) to establish a via density greater than 1.5% within the IMD layer 220 (between M4 and M5) of the region 410. It should be noted that the semiconductor device 400 may optionally employ a single metal pad configuration, and thus dummy metal vias may be inserted between the metal layers 210g (M7) and 210h (M8) as well. Further, although the dummy metal vias 235 are shown disposed between the metal layers 210d-g (M4-M7), it is understood that the metal layers may additional be disposed between the lower metal layers (M1-M3) similar to the embodiment disclosed in FIG. 3.

Figure 5:
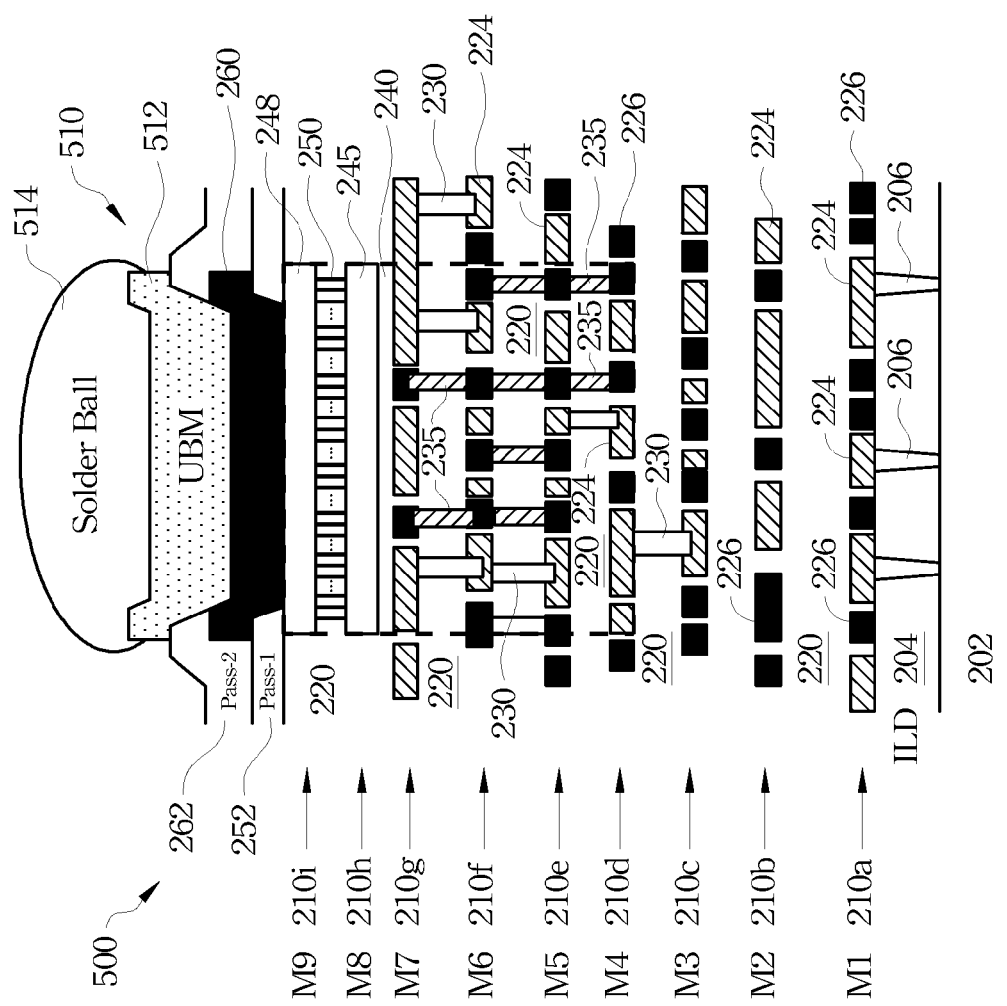
FIG. 5 is a cross-sectional view of a semiconductor device having yet another alternative embodiment of a pad structure according to various aspects of the present disclosure.

Referring to FIG. 5, illustrated is a cross-sectional view of a semiconductor device 400 having a pad structure according to various aspects of the present disclosure. In an embodiment, the semiconductor device 500 may be fabricated according to the method 100 of FIG. 1. The semiconductor device 500 is similar to the semiconductor device 200 of FIG. 2 except for the differences discussed below. Accordingly, similar features in FIGS. 2 and 5 are numbered the same for the sake of simplicity and clarity. The semiconductor device 500 includes a flip-chip assembly 510 instead of the wire bonding assembly 270 of FIG. 2. The flip-chip assembly 510 provides direct electrical connection of a face-down semiconductor device 500 onto circuit boards or substrates. The flip-chip assembly 510 is a type of chip packing that is known in the art, and thus not described in detail herein. The flip-chip assembly 510 may include an under bump metallization (UBM) structure 512 formed on a bonding pad 260. The UBM structure 512 may include various layers that provide adequate adhesion to the bonding pad 260 and passivation layer (Pass-2) 262, protection for the underlying materials, and wetting for a solder ball 514. The solder ball 514 may be formed on the UBM by evaporation, electroplating, printing, jetting, stud bumping, or other suitable technique. Although the semiconductor device 500 is shown with dummy metal vias 235 disposed within a region 240, it is understood that the region 240 may be extended to include the lower metal layers (M1-M4) similar to the embodiment disclosed in FIG. 3.

Figure 6:
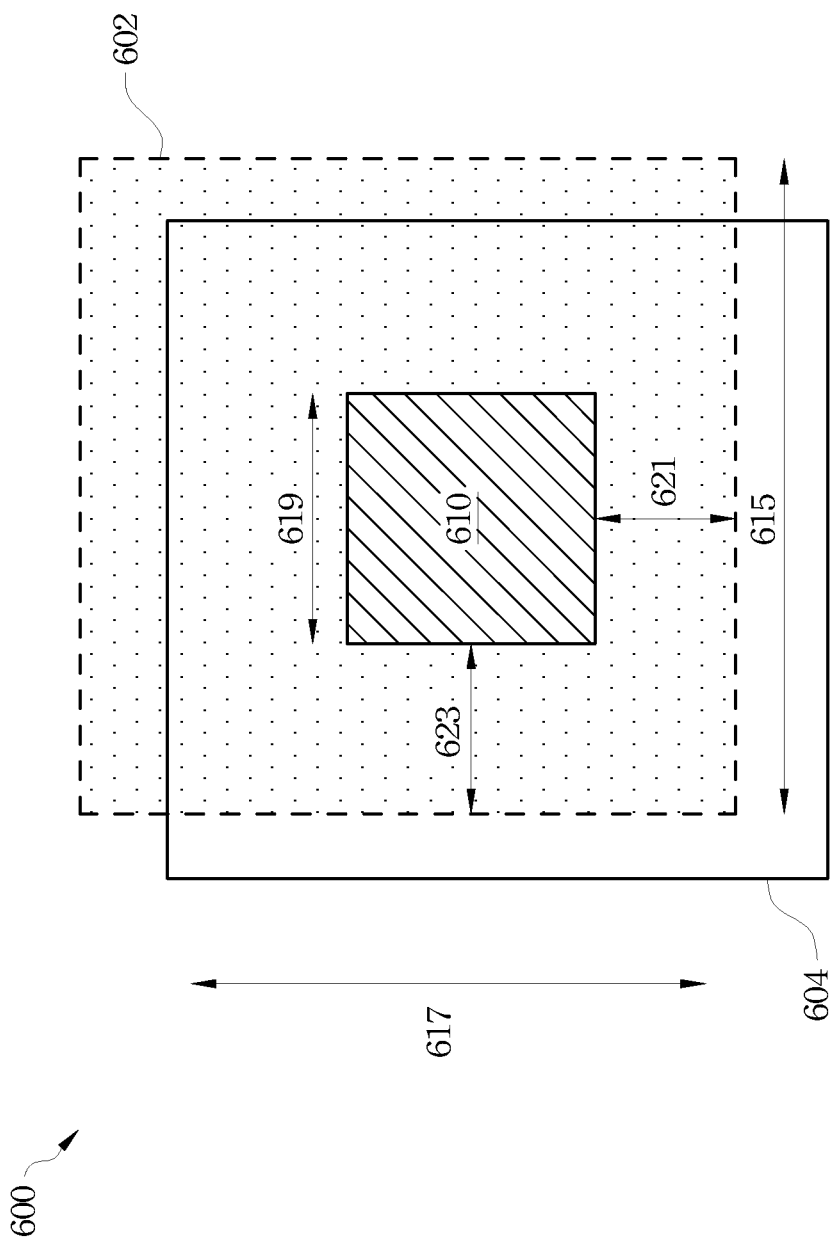
FIGS. 6-8 are schematic diagrams of various embodiments of dummy metal vias that can be implemented in the semiconductor devices of FIGS. 2-5.

Referring to FIG. 6, illustrated is a schematic diagram 600 of an embodiment of a dummy metal via that can be implemented in the various semiconductor devices 200, 300, 400, and 500 of FIGS. 2-5, respectively. In the present embodiment, the various specified dimensions are associated with 32 nm technology node process. It is understood that other dimensions may be implemented for other technology node processes (e.g., 60 nm, 45 nm, etc.). The schematic diagram 600 may be utilized for generating a design layout with dummy metal vias. The schematic diagram 600 shows two adjacent metal layers (such as metal layers 220a-i of FIGS. 2-5). As discussed above, the adjacent metal layers may each include dummy metal lines 602, 604 that are not electrically connected to any functional circuit and/or pad. The dummy metal lines 602, 604 may be connected to each other by a dummy metal via 610. The dummy metal line 602 may have a square shape including a width 615 that is approximately 0.8 um. The dummy metal line 604 may have a similar shape and size as the dummy metal line 602. The dummy metal line 602 may have an overlap 617 with the dummy metal line 604 that is approximately 0.7 um. The dummy metal via 610 may have a square shape including a width 619 that is approximately 0.35 um. The dummy metal via 610 may be spaced 621, 623 from the dummy metal line 602 at a distance that is approximately 0.175 um. It should be noted that other shapes such as ovals, circles, rectangles, other polygons, and irregular shapes may be implemented for the dummy metal vias and dummy metal lines as well.

Figure 7:
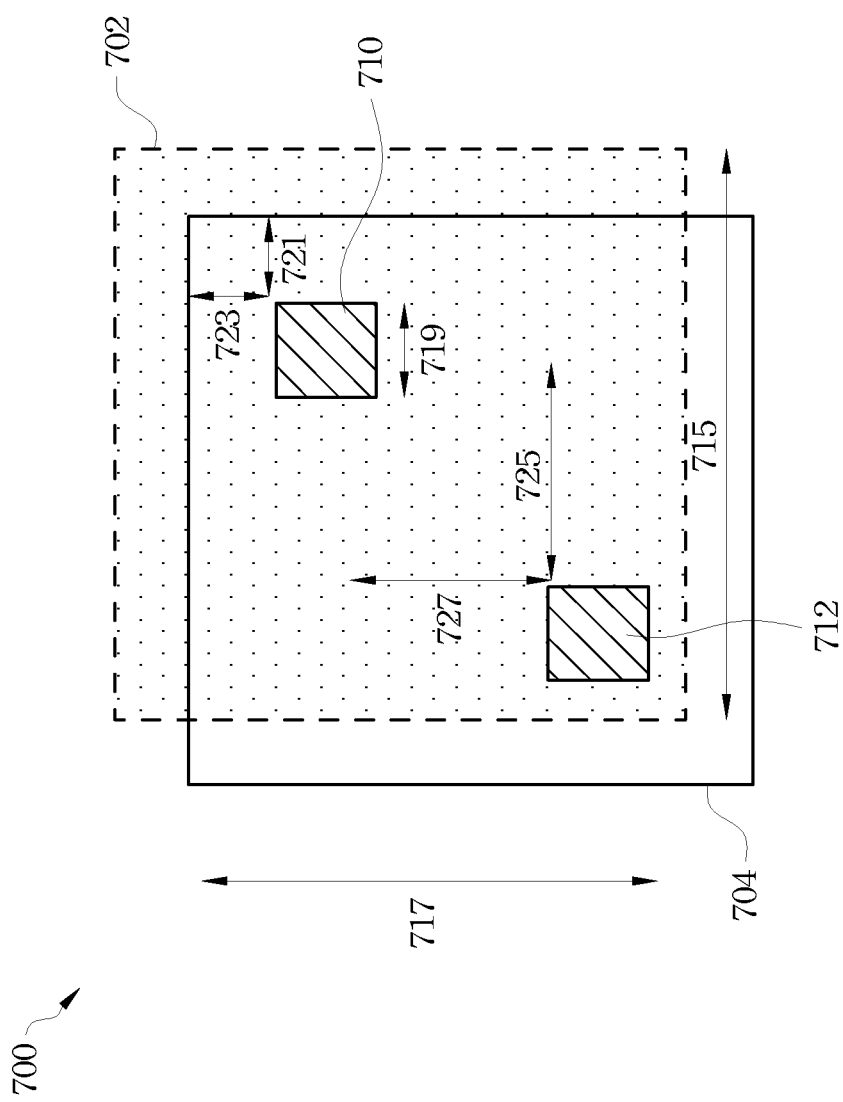

Referring to FIG. 7, illustrated is a schematic diagram 700 of another embodiment of a dummy metal via that can be implemented in the various semiconductor devices 200, 300, 400, and 500 of FIGS. 2-5, respectively. In the present embodiment, the various specified dimensions are associated with 32 nm technology node process. It is understood that other dimensions may be implemented for other technology node processes (e.g., 60 nm, 45 nm, etc.). The schematic diagram 700 may be utilized for generating a design layout with dummy metal vias. The schematic diagram 700 shows two adjacent metal layers (such as metal layers 220a-i of FIGS. 2-5). As discussed above, the adjacent metal layers may each include dummy metal lines 702, 704 that are not electrically connected to any functional circuit and/or pad. The dummy metal lines 702, 704 may be connected to each other by dummy metal vias 710, 712. The dummy metal line 702 may have a square shape including a width 715 that is approximately 0.8 um. The dummy metal line 704 may have a similar shape and size as the dummy metal line 702. The dummy metal line 702 may have an overlap 717 with the dummy metal line 704 that is approximately 0.7 um. The dummy metal vias 710, 712 may have a square shape including a width 719 that is approximately 0.14 um. The dummy metal via 710 may be spaced 721, 723 from the dummy metal line 704 at distance that is approximately 0.065 um. The dummy metal via 712 may be spaced 725, 727 a distance that is approximately 0.29 um. It should be noted that other shapes such as ovals, circles, rectangles, other polygons, and irregular shapes may be implemented for the dummy metal vias and dummy metal lines as well.

Figure 8:
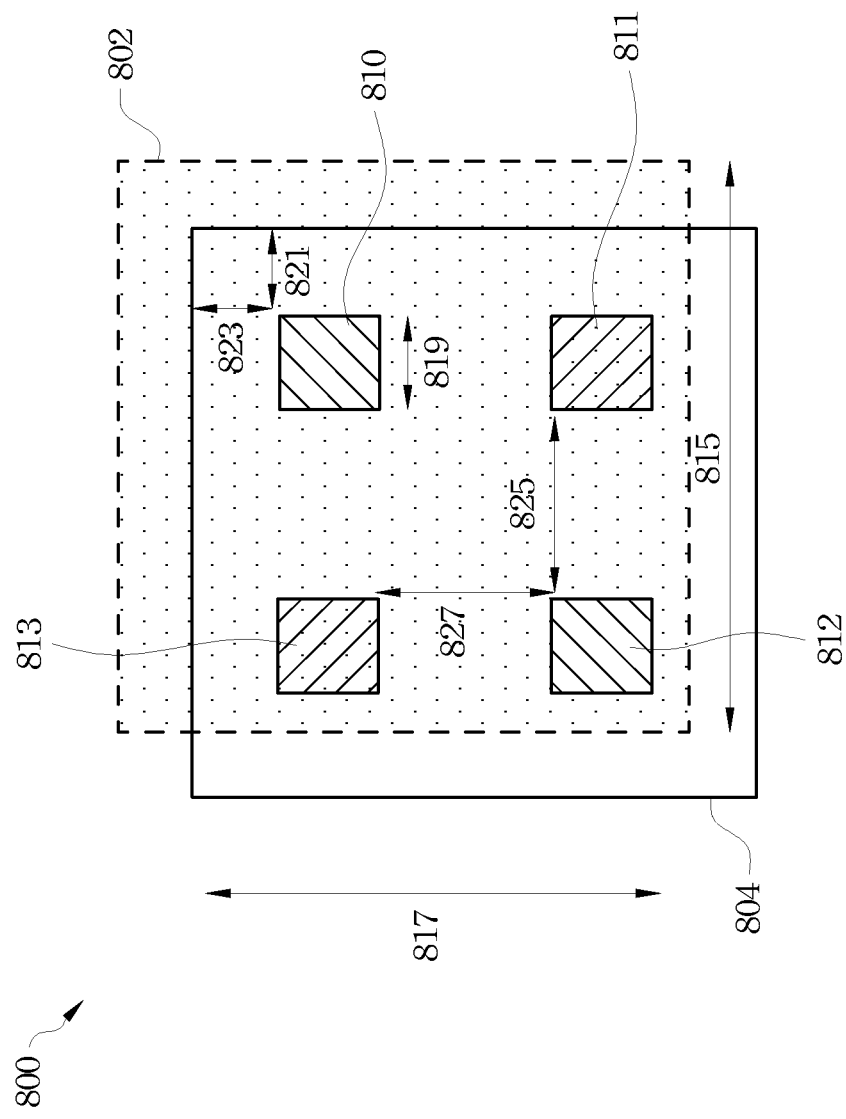

Referring to FIG. 8, illustrated is a schematic diagram 800 of another embodiment of a dummy metal via that can be implemented in the various semiconductor devices 200, 300, 400, and 500 of FIGS. 2-5, respectively. In the present embodiment, the various specified dimensions are associated with 32 nm technology node process. It is understood that other dimensions may be implemented for other technology node processes (e.g., 60 nm, 45 nm, etc.). The schematic diagram 800 may be utilized for generating a design layout with dummy metal vias. The schematic diagram 800 shows two adjacent metal layers (such as metal layers 220a-i of FIGS. 2-5). As discussed above, the adjacent metal layers may each include dummy metal lines 802, 804 that are not electrically connected to any functional circuit and/or pad. The dummy metal lines 802, 804 may be connected to each other by dummy metal vias 810, 811, 812, 813. The dummy metal line 802 may have a square shape including a width 815 that is approximately 0.8 um. The dummy metal line 804 may have a similar shape and size as the dummy metal line 802. The dummy metal line 802 may have an overlap 817 with the dummy metal line 804 that is approximately 0.7 um. The dummy metal vias 810-813 may have a square shape including a width 819 that is approximately 0.12 um. The dummy metal via 810 may be spaced 821, 823 from the dummy metal line 804 at distance that is approximately 0.14 um. The dummy metal vias 810-813 may be spaced 825, 827 from one another at a distance that is approximately 0.18 um. It should be noted that other shapes such as ovals, circles, rectangles, other polygons, and irregular shapes may be implemented for the dummy metal vias and dummy metal lines as well.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above listed processing steps can be used in combination or in parallel. Also, features illustrated and discussed in some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure. For example, the above describe embodiments can be used with any chip packing process, which may include but not limited to wire bonding, flip chip, chip bonding, and solder bump bonding. Additionally, although the various embodiments disclosed above with reference to FIGS. 6-8 show a specific number of dummy vias for connecting dummy metal lines of adjacent metal layers, it is understood that the number of vias and the position of vias may be varied to improve the mechanical strength of the dielectric layers of the interconnect structure.

What is claimed is:

1. A semiconductor device, comprising:
a semiconductor substrate having a plurality of microelectronic elements formed therein;
an interconnect structure formed over the substrate, the interconnect structure including a plurality of metal layers and a plurality of inter-metal dielectric (IMD) layers for isolating the metal layers, the metal layers including a topmost metal layer, a bottommost metal layer, and at least two metal layers disposed between the topmost metal layer and the bottommost metal layer;
a plurality of dummy metal vias formed within one or more of the IMD layers disposed between the at least two metal layers;
a plurality of real metal vias formed within the one or more of the IMD layers disposed between the at least two metal layers; and
a pad structure formed directly over the dummy metal vias,
wherein the plurality of dummy metal vias are not electrically connected to the semiconductor substrate, the pad structure, and any functional circuit,
wherein the plurality of real metal vias are electrically connected to the semiconductor substrate and the pad structure, wherein at least one real metal via from the plurality of real metal vias is disposed between a first dummy metal via and a second dummy metal via from the plurality of dummy vias directly under the pad structure.

2. The semiconductor device of claim 1, wherein the at least two metal layers are adjacent metal layers each including a dummy metal feature, the dummy feature of the adjacent metal layers, respectively, are coupled by way of one of the dummy metal vias.

3. The semiconductor device of claim 1, wherein the pad structure is formed within the topmost metal layer.

4. The semiconductor device of claim 3, wherein the metal layers include a second topmost metal layer adjacent the topmost metal layer, and wherein the second topmost metal layer includes another pad structure that is coupled to the pad structure of the topmost metal layer by way of a plurality of top metal vias.

5. The semiconductor device of claim 1, wherein the at least two metal layers include seven metal layers; and
wherein the dummy metal vias are disposed between any two of the seven metal layers.

6. The semiconductor device of claim 5, wherein the dummy metal vias are disposed between five of the seven metal layers closest to the topmost metal layer.

7. The semiconductor device of claim 1, wherein the inter-metal dielectric layers have a dielectric constant that does not exceed 2.5.

8. The semiconductor device of claim 1, wherein the dummy metal vias and the real metal vias combine to establish a via density that is greater than 1.5%, the via density being calculated within a region of the interconnect structure that directly underlies the pad structure.

9. A semiconductor device, comprising:
a semiconductor substrate having a plurality of microelectronic elements formed therein;
an interconnect structure formed over the semiconductor substrate, the interconnect structure including a topmost metal layer and a bottommost metal layer, the topmost metal layer including a metal pad;
a plurality of dummy metal vias formed within one or more inter-metal dielectric (IMD) layers disposed between the topmost metal layer and the bottommost metal layer, the dummy metal vias directly underlying the metal pad of the topmost metal layer, the dummy vias establishing a pre-determined via density within a region of the interconnect structure that directly underlies the metal pad of the topmost metal layer, wherein the plurality of dummy metal vias are not electrically connected to the semiconductor substrate and the metal pad; and
a plurality of real metal vias formed within the one or more IMD layers disposed between the topmost metal layer and the bottommost metal layer, the plurality of real metal vias directly underlying the metal pad of the topmost metal layer, wherein the plurality of real metal vias are electrically connected to the semiconductor substrate and the metal pad, wherein at least one real metal via from the plurality of real metal vias is disposed in a first IMD layer between adjacent dummy metal vias from the plurality of dummy metal vias that are disposed in the first IMD layer.

10. The semiconductor device of claim 9, further comprising a bonding pad formed over the topmost metal layer and coupled to the metal pad.

11. The semiconductor device of claim 10, further comprising one of a wire bond assembly and a flip-chip assembly coupled to the bonding pad.

12. The semiconductor device of claim 11, wherein the dummy metal vias and the real metal vias combine to establish a via density that is greater than 1.5%, the via density being calculated within a region of the interconnect structure that directly underlies the bonding pad.

13. The semiconductor device of claim 9, wherein the interconnect structure further includes a plurality of other metal layers disposed between the topmost metal layer and the bottommost metal layer; and wherein the dummy metal vias are disposed between an upper half of the other metal layers closest to the topmost metal layer.

14. A method of fabricating a semiconductor device, comprising:

providing a semiconductor substrate having a plurality of microelectronic elements formed therein;

forming an interconnect structure over the substrate, the interconnect structure including a plurality of metal layers and a plurality of inter-metal dielectric (IMD) layers, the metal layers including a topmost metal layer, a bottommost metal layer, and at least two metal layers disposed between the topmost metal layer and the bottommost metal layer;

forming a plurality of dummy metal vias within one or more IMD layers disposed between the at least two metal layers; and forming a pad structure directly over the dummy metal vias, wherein the plurality of dummy metal vias are not electrically connected to the semiconductor substrate, the pad structure, and any functional circuit.

15. The method of claim 14, wherein the forming the pad structure is performed in a same process that forms the topmost metal layer of the interconnect structure.

16. The method of claim 14, wherein the forming the pad structure includes forming a bonding pad over the topmost metal layer, the bonding pad being coupled to a metal pad of the topmost metal layer; and wherein the method further comprises forming one of a wire bond assembly and a flip-chip assembly on the bonding pad.

17. The method of claim 14, wherein forming the interconnect structure further includes forming a plurality of real metal vias in one or more IMD layers;

wherein the dummy metal vias and the real metal vias combine to establish a via density that is greater than 1.5%, the via den the via density being calculated within a region of the interconnect structure that directly underlies the pad structure.

18. The method of claim 14, wherein the at least two metal layers include seven metal layers, and wherein the dummy metal vias are disposed between five of the seven metal layers closest to the topmost metal layer.

19. The semiconductor device of claim 1, wherein the at least one real metal via, the first dummy metal via, and the second dummy metal via are disposed directly under the pad structure in one of the IMD layers and do not extend laterally within the one of the IMD layers beyond an outer perimeter of the pad structure.

20. The semiconductor device of claim 9, wherein the plurality of dummy metal vias are not electrically connected to any functional circuit.

* * * * *